United States Patent
Han et al.

(10) Patent No.: US 12,146,215 B2
(45) Date of Patent: Nov. 19, 2024

(54) PLATED STEEL PLATE HAVING EXCELLENT GLOSSINESS AND SURFACE PROPERTY, AND METHOD FOR MANUFACTURING SAME

(71) Applicant: POSCO, Pohang-si (KR)

(72) Inventors: Hyeon-Soop Han, Gwangyang-si (KR); Young-Jin Kwak, Gwangyang-si (KR); Tae-Yeob Kim, Gwangyang-si (KR); Jin-Tae Kim, Gwangyang-si (KR)

(73) Assignee: POSCO CO., LTD, Pohang-si (KR)

( * ) Notice: Subject to any disclaimer, the term of this patent is extended or adjusted under 35 U.S.C. 154(b) by 625 days.

(21) Appl. No.: 17/414,222

(22) PCT Filed: Nov. 27, 2019

(86) PCT No.: PCT/KR2019/016479
§ 371 (c)(1),
(2) Date: Jun. 15, 2021

(87) PCT Pub. No.: WO2020/130396
PCT Pub. Date: Jun. 25, 2020

(65) Prior Publication Data
US 2022/0042163 A1 Feb. 10, 2022

(30) Foreign Application Priority Data
Dec. 19, 2018 (KR) ........................ 10-2018-0165569

(51) Int. Cl.
*C23C 14/16* (2006.01)
*C08F 222/22* (2006.01)
(Continued)

(52) U.S. Cl.
CPC ............ *C23C 14/16* (2013.01); *C08F 222/22* (2013.01); *C09D 4/00* (2013.01); *C09D 135/02* (2013.01);
(Continued)

(58) Field of Classification Search
None
See application file for complete search history.

(56) References Cited

U.S. PATENT DOCUMENTS

2007/0082220 A1 4/2007 Gonzalez Ramos
2010/0285333 A1* 11/2010 Kwak .................. C23C 14/548
427/598

(Continued)

FOREIGN PATENT DOCUMENTS

| CN | 103080385 | 5/2013 |
| CN | 203994915 | 12/2014 |

(Continued)

OTHER PUBLICATIONS

Chinese Office Action—Chinese Application No. 201980084796.4 issued on Oct. 27, 2022.

(Continued)

*Primary Examiner* — Kim S. Horger
(74) *Attorney, Agent, or Firm* — CANTOR COLBURN LLP

(57) ABSTRACT

Provided is a plated steel plate used for interior materials and exterior materials such as home appliances, construction materials, vehicles, etc., and a method for manufacturing same. The plated sheet plate includes: base steel; a Zn—Mg plating layer formed on the base steel; and a UV-curable film layer formed on the Zn—Mg plating layer, wherein a hairline pattern is formed on a surface of the Zn—Mg plating layer, and the Zn—Mg plating layer includes 8 to 27 weight % of Mg and a balance of Zn and inevitable impurities.

11 Claims, 1 Drawing Sheet

(51) Int. Cl.
    *C09D 4/00*           (2006.01)
    *C09D 135/02*      (2006.01)
    *C22C 18/00*        (2006.01)
    *C23C 14/28*        (2006.01)
    *C23C 14/58*        (2006.01)

(52) U.S. Cl.
    CPC .............. *C22C 18/00* (2013.01); *C23C 14/28* (2013.01); *C23C 14/58* (2013.01); *C08F 2800/20* (2013.01)

(56) References Cited

U.S. PATENT DOCUMENTS

| | | | |
|---|---|---|---|
| 2012/0219823 A1 | 8/2012 | Myers | |
| 2012/0258324 A1 | 10/2012 | Kim et al. | |
| 2015/0314567 A1 * | 11/2015 | Böger | C25D 3/58 428/656 |
| 2017/0354991 A1 * | 12/2017 | Kim | B05D 3/067 |
| 2018/0363147 A1 | 12/2018 | Kim et al. | |
| 2020/0002803 A1 | 1/2020 | Kwak et al. | |

FOREIGN PATENT DOCUMENTS

| | | |
|---|---|---|
| CN | 203994915 U * | 12/2014 |
| EP | 3384998 A1 | 10/2018 |
| JP | H09143679 | 6/1997 |
| JP | 2013508470 | 3/2013 |
| JP | 3192959 | 9/2014 |
| KR | 19940000086 | 1/1994 |
| KR | 100833073 | 5/2008 |
| KR | 100833073 B1 * | 5/2008 |
| KR | 20100030082 | 3/2010 |
| KR | 20120050732 | 5/2012 |
| KR | 20130074522 | 7/2013 |
| KR | 101510556 | 4/2015 |
| KR | 101746974 | 6/2017 |
| KR | 20170120165 | 10/2017 |
| KR | 20180075429 | 7/2018 |
| WO | 2018124630 | 7/2018 |
| WO | 2018124649 | 7/2018 |

OTHER PUBLICATIONS

Japanese Office Action—Japanese Application No. 2021-534750 issued on Sep. 13, 2022.
International Search Report—PCT/KR2019/016479 dated Mar. 5, 2020.
EP Extended Search Report issued Dec. 3, 2021 re: Application No. PCT/KR2019/016479, pp. 1-7, citing: Prosek et al. "Coil-coated Zn—Mg . . . ", EP 3 384 998 A1, KR 2017 0120165 A, KR 101 510 556 B1 amd KR 940 000 086 B1.
Tomas Prosek et al., "Coil-coated Zn—Mg and Zn—Al—Mg: Effect of climatic parameters on the corrosion at cut edges", Progress in Organic Coating, 2015, vol. 83, pp. 26-35.

* cited by examiner

PLATED STEEL PLATE HAVING EXCELLENT GLOSSINESS AND SURFACE PROPERTY, AND METHOD FOR MANUFACTURING SAME

TECHNICAL FIELD

The present disclosure relates to a plated steel sheet used for interior materials and exterior materials of home appliances, construction materials, vehicles, and the like, and a method for manufacturing same.

BACKGROUND ART

Steel sheets used for interior and exterior materials for home appliances, construction materials, vehicles, and the like, should have an aesthetically pleasing appearance while having excellent corrosion resistance. Since stainless steel sheets are able to secure both corrosion resistance and surface appearance, they have been widely used.

In general, a stainless steel sheet is subjected to a surface finishing process to obtain an aesthetically pleasing appearance. As a surface finishing process, a method of forming a hairline pattern is used. In such a method of forming a hairline pattern, a surface of a steel material may be polished with an appropriate abrasive agent such that polishing marks remain on the polished surface. Thus, long and continuous hair-like lines may be formed on the polished surface to secure an aesthetically pleasing appearance.

Unfortunately, such a stainless steel sheet is expensive and uneconomical. Additional coating may be performed to prevent fingerprint marks or external contamination after the hairline pattern is formed, but the surface of the stainless steel sheet suffers from issues such as poor adhesion of coating, and the like.

Accordingly, there is continuous demand for a steel material, capable of replacing the stainless steel sheet.

DISCLOSURE

Technical Problem

An aspect of the present disclosure is to provide a plated steel sheet having excellent surface characteristics and excellent glossiness and corrosion resistance.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Technical Solution

According to an aspect of the present disclosure, a plated sheet plate having excellent glossiness and surface characteristics includes: base steel; a Zn—Mg plating layer formed on the base steel; and a UV-curable film layer formed on the Zn—Mg plating layer. A hairline pattern is formed on a surface of the Zn—Mg plating layer, and the Zn—Mg plating layer includes 8 to 27 weight % of Mg and a balance of Zn and inevitable impurities.

According to another aspect of the present disclosure, a method of manufacturing a plated steel sheet having excellent glossiness and surface characteristics includes: preparing base steel; forming a Zn—Mg plating layer on the base steel by vacuum deposition, the Zn—Mg plating layer including 8 to 27 weight % of Mg and a balance of Zn and inevitable impurities; forming a hairline pattern on a surface of the Zn—Mg plating layer; coating a UV-curable paint on the Zn—Mg plating layer; and curing the UV-curable paint to form a UV-curable film layer.

Advantageous Effects

According to the present disclosure, a plated steel sheet having both excellent surface characteristics and excellent glossiness by reducing surface stains, defects, and the like, may be provided. In particular, economical interior and exterior materials for home appliances, construction materials, vehicles, and the like, may be provided in place of expensive stainless steel sheets.

BEST MODE FOR INVENTION

Hereinafter, the present disclosure will be described in detail.

The plated steel sheet according to the present disclosure may include base steel, a Zn—Mg plating layer formed on the base steel, and a UV-curable film layer formed on the Zn—Mg plating layer.

The type of the base steel is not limited, and any type of steel may be employed as long as it is used for home appliances, construction materials, and the like, to which the present disclosure may be applied. In addition, the base steel may have any form such as hot-rolled steel, cold-rolled steel, a thick plate, a wire rod, or the like.

The Zn—Mg plating layer may be present on the base steel. The Zn—Mg plating layer may include, in detail, 8 to 27 weight % of Mg and a balance of Zn and inevitable impurities. When the content of Mg is less than 8 weight %, it may be difficult to secure excellent glossiness. When the content of Mg is greater than 27 weight %, there is high probability that hardness of the plating layer is increased and a surface defect such as stains or cracking may occur. Therefore, the content of Mg may not be greater than, in detail, 27 weight %. As will be described later, when the Zn—Mg plating layer has a double-layer structure, the content of Mg in the entire plating layer may be, in detail, 8 to 27 weight %.

As an example of a method of forming the Zn—Mg plating layer, in detail, vacuum deposition may be used to secure excellent surface characteristics and glossiness of the plating layer.

Figure 1:
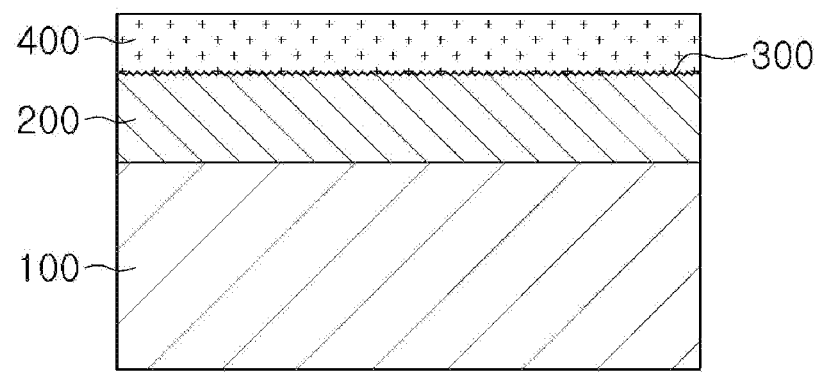
FIG. 1 is a schematic view of a plated steel sheet including a Zn—Mg plating layer having a single-layer structure according to the present disclosure.
Figure 2:
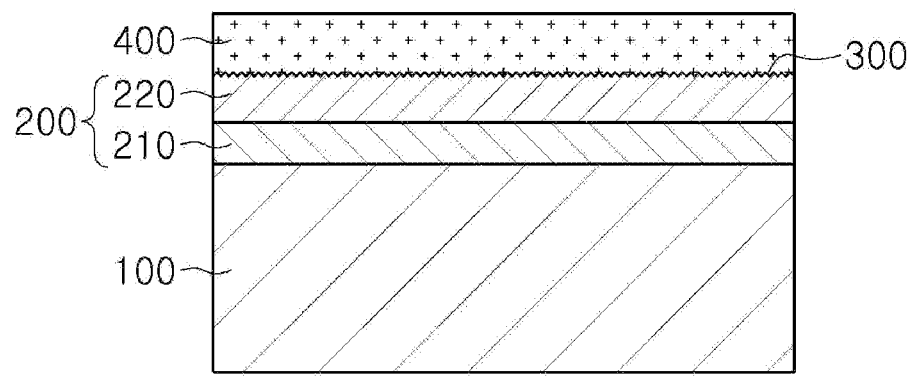
FIG. 2 is a schematic view of a plated steel sheet including a Zn—Mg plating layer having a double-layer structure according to the present disclosure.

The Zn—Mg plating layer may have a single-layer structure, or a double-layer structure in which a Zn plating layer is disposed between the Zn—Mg plating layer and the base steel. This is schematically illustrated in FIGS. 1 and 2. That is, FIG. 1 illustrates a structure in which a Zn—Mg plating layer 200 is formed on base steel 100, a hairline pattern 300 is provided on a surface of the Zn—Mg plating layer, and a UV-curable film layer 400 is formed on the hairline pattern 300.

FIG. 2 illustrates a Zn—Mg plating layer having a double-layer structure. More specifically, a Zn layer 210 may be formed between a Zn—Mg layer 220 and base steel 100. A hairline pattern 300 and a UV-curable film layer 400 of FIG. 2 are the same as those of FIG. 1. In the structure of FIG. 2, the Zn layer 210 may serve to improve adhesion between the base steel and the Zn—Mg layer 220.

In detail, a hairline pattern may be formed on a surface of the Zn—Mg plating layer. Hairline texture and designabilty may be provided through the hairline pattern. A shape, a depth, and the like, of the hairline pattern are not limited, and the hairline pattern may be formed to be appropriate for use, a client's request, and the like.

A UV-curable film layer may be formed on the Zn—Mg plating layer. The UV-curable film layer may preferably be transparent. The UV-curable film layer may preferably be formed by coating a UV-curable paint to be described later and curing the coated UV-curable paint.

The UV-curable film layer may have a thickness of, in detail, 0.8 to 1.2 μm. When the thickness of the UV-curable film layer is greater than 1.2 μm, it may be advantageous for clarity or surface gloss but a thickness of a paint coating film may be increased to cause difficulty in formation. When the thickness of the UV-curable film layer is less than 0.8 μm, it may be difficult to secure quality of corrosion resistance or high clarity and high glossiness. The thickness of the UV-curable film layer may be, in further detail, about 1 μm.

Glossiness of a plated steel sheet according to the present disclosure may be measured using a glossmeter. When reflectivity of glass is 100 during measurement of the glossiness at a measurement angle of 60 degrees, the glossiness may have a relative value of, in detail, 60 to 120.

Hereinafter, a method of manufacturing a plated steel sheet according to the present disclosure will be described in detail. Specifically, the method may include preparing base steel, forming a Zn—Mg plating layer on a surface of the base steel, forming a hairline pattern on a surface of the Zn—Mg plating layer, coating UV-curable paint on the Mg—Zn plating layer, and curing the UV-curable paint to forma UV-curable film layer.

The method may include a process of removing an oxide and a foreign object on the surface of the base steel before forming the Zn—Mg plating layer on the surface of the base steel.

The Zn—Mg plating layer may be formed using, in detail, a vacuum deposition method. As the vacuum deposition method, for example, an electron beam method, a sputtering method, a thermal evaporation method, an induction heating evaporation method, an ion plating method or the like may be applied. However, when the Zn—Mg plating layer is formed, in detail, an electromagnetic levitation induction heating method having an electromagnetic stirring effect may be used.

Excellent glossiness may be secured when the Zn—Mg plating layer is formed using the vacuum deposition method, in detail, the electromagnetic levitation physical vapor deposition method, rather than an electroplating method or a hot-dip galvanizing method, among the methods of forming Zn—Mg plating layer.

The electromagnetic levitation physical vapor deposition method may refer to a method using a phenomenon in which, when electromagnetic force is generated by applying radio-frequency power to a pair of electromagnetic coils generating an alternating current (AC) electromagnetic field, a coating material (Zn, Mg, or a Zn—Mg alloy in the present disclosure) may be lifted into the air in the space surrounded by the AC electromagnetic field without any external help, and the lifted coating material may generate a large amount of deposition vapor (metal vapor). In the electromagnetic levitation physical vapor depiction method, the deposition vapor may be sprayed onto a surface of base steel to form a plating layer.

In a general vacuum deposition device, a coating material may be provided in a crucible and the coating material may be vaporized by heating the crucible including the coating material. In this case, it may be difficult to provide sufficient thermal energy to the coating material because of dissolution of the crucible, heat loss caused by the crucible, and the like. Accordingly, a deposition rate may be low, and there may be a certain limitation in refining grains forming the deposition layer. In addition, when Zn—Mg alloy vapor is required to be deposited, there may also be a predetermined limitation in securing homogeneity of a plating layer. However, when the deposition is performed by an electromagnetic levitation physical vapor deposition method, unlike a general vacuum deposition method, the coating material may be exposed to a higher temperature without constraint conditions related to a temperature. Accordingly, high-rate deposition may be performed to achieve the refinement of grains forming a formed plating layer and homogeneity of an alloy element distribution in the plating layer.

During the electromagnetic levitation physical vapor deposition, the degree of vacuum in a chamber may be, in detail, $1.0 \times 10^{-3}$ mbar to $1.0 \times 10^{-5}$ mbar. This is aimed at effectively preventing an increase of embrittlement and degradation of physical properties caused by an oxide formed during formation of the plating layer.

During the electromagnetic levitation physical vapor deposition process, a temperature of the lifted coating material may be adjusted to be, in detail, 700° C. or more. When the temperature of the lifted coating material is less than 700° C., the refinement of the grains and the homogeneity of the plating layer may be insufficiently secured. An upper limit of the temperature is not limited. However, when the temperature is a certain level or higher, the above-described effects may be saturated and process costs may be significantly increased. In consideration thereof, the upper limit of the temperature may be set to be 1500° C.

A difference in temperature in a width direction of the base steel after the deposition may be adjusted to be, in detail, 100° C. or less. When the difference in temperature is greater than 100° C., maintenance of the degree of vacuum may be disturbed by bending in a width direction caused by unevenness of a temperature of a width steel sheet while passing through a multiple-stage differentiated pressure reducing system at an exit side.

A hairline pattern may be formed on the formed Zn—Mg plating layer. A method of forming the hairline pattern is not limited, and may be a roll method or physical means. As an example, equipment including an abrasive member such as sandpaper may be disposed on a rear end of a Zn—Mg vacuum deposition apparatus or a front end of UV-curable coating equipment to form a hairline. A pattern, a depth, and the like, of the hairline are not limited, and the hairline may be formed to be appropriate for use, client's request, and the like.

A UV-curable paint may be coated on the Zn—Mg plating layer on which the hairline pattern is formed, and then cured to form a UV-curable film layer.

The UV-curable paint may be a coating composition which may be cured by ultraviolet (UV) such as radiation, or the like.

As an example, a base resin composition may be used. The base resin composition may include a multifunctional urethane (meth) acrylate having three or more functional groups at 3 to 35 parts by weight, a bifunctional urethane (meth) acrylate at 3 to 35 parts by weight, at least one (meth) acrylic acid ester monomer at 20 to 60 parts by weight selected from a monofunctional (meth) acrylic acid ester monomer and a multifunctional (meth) acrylic acid ester monomer, and a radiation polymerization initiator at 0.1 to 15 parts by weight.

As a method of coating the UV-curable paint, various methods such as a roll coating method, a flow coating method, a slot coating method, and a curtain coating method may be used. The UV-curable paint may be coated such that the UV-curable film layer may have a thickness of, in detail, 0.8 to 1.2 μm. As an example, the UV-curable paint may be coated in a coating amount of, in detail, 800 to 1200 mg/m$^2$.

According to a method of curing the UV-curable paint, the UV-curable paint may be coated and then UV ray may be irradiated to cure the UV-curable paint. In this case, in detail, an ultraviolet lamp may be used, and the UV may have a wavelength of, in detail, 280 to 400 nm.

MODE FOR INVENTION

Hereinafter, the present disclosure will be described in more detail through examples. However, it is necessary to note that the following examples are only intended to illustrate the present disclosure in more detail and are not intended to limit the scope of the present disclosure. This is because the scope of the present disclosure is determined by matters described in the claims and able to be reasonably inferred therefrom.

Example

A cold-rolled steel sheet, including, by weight %, 0.125% of carbon (C), 0.102% of silicon (Si), 0.019% of titanium (Ti), 0.012% of copper (Cu), and a balance of iron (Fe) and inevitable impurities, and having a thickness of 1.0 mm, was prepared. A Zn—Mg plating layer was formed by electromagnetic levitation physical vapor deposition while changing a plating adhesion amount and a content of Mg, as s illustrated in Table 1 below. In this case, a double-layer structure refers to a structure in which a Zn plating layer is formed on a surface of a steel sheet and then a Zn—Mg plating layer is formed on the Zn plating layer. In this case, plating conditions were as follows.

Degree of vacuum: 3.2×10$^{-4}$ mbar
Temperature of vapor distribution box: 1000° C.
Electromagnetic coil current: 1.6 kA
Weight of supplied coating materials: Zn(3 kg) and Zn—Mg alloy (3.3 kg)

In Table 1, conventional example are Zn-plated steel sheets manufactured using a hot-dip galvanizing method (GI) and an electroplating method (EG).

A hairline pattern was formed on a surface of a plating layer of the plated steel sheet manufactured as described above using a sandpaper polishing machine, a UV-curable paint was coated on a Zn layer/a Zn—Mg layer (a double-layer structure) and a Zn—Mg plating layer (a single-layer structure), and then cured using a UV lamp to form a transparent UV-curable film layer having a thickness of about 1 mm. In this case, the UV-curable paint was a paint including a urethane acrylate having 2, 3 or 6 functional groups; IBOA, THFA, and phosphate acrylate as a monomer; Irgacre 1840 and Darocure 1173 as a photoinitiator; wax as another additive for complementing physical properties; SiO2 particles; a dispersant; and a leveling agent.

Glossiness and surface characteristics were observed on a surface of the UV-curable film layer using a glossmeter, and an observation result is listed in Table 1.

The glossiness was evaluated using the glossmeter after cutting a plated steel sheet into specimens each having a size of 75 mm×150 mm. The glossmeter was measured using a glossmeter (BYK-Gardner Co., Ltd.) and was represented as a relative value when reflectivity of glass was 100 during measurement of the glossiness at a measurement angle of 60 degrees.

The surface characteristics, obtained by observing the surface uniformity, such as surface defects and stains were evaluated with naked eye observation by being relatively compared with an electro-galvanized steel sheet (EG) and a hot-dip galvanized steel sheet (GI) of the conventional example, and criteria thereof were as follows.

1: Excellent
2: Normal (Around Gi 60 g/M$^2$)
3: Poor

TABLE 1

| | Configuration of Plating Layer | Coating Weight (g/m$^2$) | Content of Mg in Plating Layer (wt %) | Glossiness | Surface Characteristics | Remarks |
|---|---|---|---|---|---|---|
| CvE 1 | GI | 60 | — | 38 | 2 | — |
| CvE 2 | EG | 20 | — | 40 | 2 | — |
| CpE 1 | Zn/Zn—Mg | 20/20 | 5 | 50 | 1 | a double-layer structure |
| CpE 2 | Zn/Zn—Mg | 30/30 | 5 | 52 | 1 | |
| IE 1 | Zn/Zn—Mg | 20/20 | 10 | 61 | 1 | |
| IE 2 | Zn/Zn—Mg | 30/30 | 10 | 65 | 1 | |
| IE 3 | Zn/Zn—Mg | 20/20 | 15 | 73 | 1 | |
| IE 4 | Zn/Zn—Mg | 30/30 | 15 | 77 | 1 | |
| IE 5 | Zn/Zn—Mg | 20/20 | 20 | 83 | 1 | |
| IE 6 | Zn/Zn—Mg | 30/30 | 20 | 87 | 1 | |
| IE 7 | Zn/Zn—Mg | 20/20 | 25 | 95 | 1 | |
| IE 8 | Zn/Zn—Mg | 30/30 | 25 | 98 | 1 | |
| CpE 3 | Zn/Zn—Mg | 20/20 | 30 | 110 | 3 | |
| CpE 4 | Zn/Zn—Mg | 30/30 | 30 | 120 | 3 | |
| IE 9 | Zn—Mg | 20 | 8 | 60 | 1 | a single-layer structure |
| IE 10 | Zn—Mg | 30 | 9 | 65 | 1 | |
| IE 11 | Zn—Mg | 20 | 10 | 76 | 1 | |
| IE 12 | Zn—Mg | 30 | 10 | 80 | 1 | |
| IE 13 | Zn—Mg | 20 | 15 | 86 | 1 | |
| IE 14 | Zn—Mg | 30 | 15 | 92 | 1 | |
| IE 15 | Zn—Mg | 20 | 20 | 97 | 1 | |
| IE 16 | Zn—Mg | 30 | 20 | 104 | 1 | |
| IE 17 | Zn—Mg | 20 | 25 | 110 | 1 | |
| IE 18 | Zn—Mg | 30 | 25 | 120 | 1 | |
| CpE 5 | Zn—Mg | 20 | 30 | 140 | 3 | |
| CpE 6 | Zn—Mg | 30 | 30 | 150 | 3 | |

CvE: Conventional Example
CpE: Comparative Example
IE: Inventive Example

As can be seen from results in Table 1, in Conventional Examples 1 and 2, glossiness was not so high even after a UV-curable film layer was formed.

In Inventive Examples satisfying the conditions of the present disclosure, excellent glossiness and surface characteristics were secured.

In Comparative Examples 1 and 2, satisfactory glossiness was not obtained because a content of Mg in a plating layer was significantly low. As a content of Mg in a plating layer is increased, glossiness is also increased. However, when the content of Mg was significantly high as in Comparative Examples 3 to 6, surface characteristics may be deteriorated. In particular, in the case of Examples 5 and 6, there occurs problems that glossiness was too much increased.

The invention claimed is:

1. A plated steel sheet having glossiness and surface characteristics, the plated steel sheet including:
   a base steel;
   a Zn—Mg plating layer formed on the base steel, the Zn—Mg plating layer having a hairline pattern on a surface thereof;
   a UV-curable film layer formed directly on the Zn—Mg plating layer; and
   a glossiness, the glossiness having a relative value of 60 to 120 when a reflectivity of glass is 100 during measurement of the glossiness using a glossmeter at a measurement angle of 60 degree,
   wherein the Zn—Mg plating layer includes 8 to 27 weight % of Mg and a balance of Zn and inevitable impurities, and
   the UV-curable film layer has a thickness of 0.8 to 1.2 µm.

2. The plated steel sheet of claim 1, wherein the UV-curable film layer is transparent.

3. The plated steel sheet of claim 1, wherein the Zn—Mg plating layer has a double-layer structure including a Zn layer on the base steel and a Zn—Mg layer on the Zn layer.

4. A method of manufacturing a plated steel sheet according to claim 1 having excellent glossiness and surface characteristics, the method comprising:
   preparing base steel;
   forming a Zn—Mg plating layer on the base steel by vacuum deposition, the Zn—Mg plating layer including 8 to 27 weight % of Mg and a balance of Zn and inevitable impurities;
   forming a hairline pattern on a surface of the Zn—Mg plating layer;
   coating a UV-curable paint on the Zn—Mg plating layer; and
   curing the UV-curable paint to form a UV-curable film layer.

5. The method of claim 4, wherein the UV-curable paint is a resin composition including a multifunctional urethane (meth)acrylate having three or more functional groups at 3 to 35 parts by weight, a bifunctional urethane(meth)acrylate at 3 to 35 parts by weight, at least one (meth)acrylic acid ester monomer at 20 to 60 parts by weight selected from a monofunctional (meth)acrylic acid ester monomer and a multifunctional (meth)acrylic acid ester monomer, and a radiation polymerization initiator at 0.1 to 15 parts by weight.

6. The method of claim 4, wherein the UV-curable paint is coated in a coating amount of 800 to 1200 mg/m$^2$.

7. The method of claim 4, wherein the curing of the UV-curable paint is performed by irradiating ultraviolet ray having a wavelength of 280 to 400 nm.

8. The method of claim 4, wherein the vacuum deposition is performed using electromagnetic levitation physical vapor deposition.

9. The method of claim 8, wherein during the electromagnetic levitation physical vapor deposition, a degree of vacuum in a chamber is $1.0 \times 10^{-3}$ mbar to $1.0 \times 10^{-5}$ mbar.

10. The method of claim 8, wherein during the electromagnetic levitation physical vapor deposition process, a temperature of a coating material is 700° C. or more.

11. The method of claim 8, wherein during the electromagnetic levitation physical vapor deposition process, a difference in temperature in a width direction of the base steel after deposition is 100° C. or less.

* * * * *